US012713764B2

(12) United States Patent
Park

(10) Patent No.: US 12,713,764 B2
(45) Date of Patent: Aug. 18, 2026

(54) DISPLAY DEVICE CAPABLE OF PREVENTING WHITENING PHENOMENON FROM OCCURRING DURING FOLDING BY REDUCING STRESS OF PROTECTION MEMBER

(71) Applicant: LG Display Co., Ltd., Seoul (KR)

(72) Inventor: Eun-Ju Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 564 days.

(21) Appl. No.: 18/072,424

(22) Filed: Nov. 30, 2022

(65) Prior Publication Data

US 2023/0209870 A1 Jun. 29, 2023

(30) Foreign Application Priority Data

Dec. 28, 2021 (KR) ........................ 10-2021-0189617

(51) Int. Cl.

| | |
|---|---|
| ***H10K 50/844*** | (2023.01) |
| ***H10K 50/80*** | (2023.01) |
| ***H10K 50/86*** | (2023.01) |
| ***H10K 59/80*** | (2023.01) |
| *H10K 102/00* | (2023.01) |

(52) U.S. Cl.

CPC ......... *H10K 50/865* (2023.02); *H10K 50/844* (2023.02); *H10K 50/868* (2023.02); *H10K 59/8722* (2023.02); *H10K 59/873* (2023.02); *H10K 2102/311* (2023.02)

(58) Field of Classification Search

None

See application file for complete search history.

(56) References Cited

U.S. PATENT DOCUMENTS

2018/0354227 A1* 12/2018 Park ........................ B32B 27/12
2020/0257023 A1* 8/2020 Ahn ...................... B32B 27/281
2021/0202879 A1* 7/2021 Park ......................... G02B 1/14
2022/0375880 A1* 11/2022 Kim ...................... G06F 3/0446

FOREIGN PATENT DOCUMENTS

| | | | |
|---|---|---|---|
| CN | 103513318 | A | 1/2014 |
| CN | 111755482 | A | 10/2020 |
| CN | 113270034 | A | 8/2021 |
| JP | 2014-157227 | A | 8/2014 |
| KR | 20-0424093 | Y1 | 8/2006 |
| KR | 10-2018-0136038 | A | 12/2018 |
| KR | 10-2020-0019025 | A | 2/2020 |
| KR | 10-2147349 | B1 | 8/2020 |

* cited by examiner

*Primary Examiner* — Daniel Whalen

(74) *Attorney, Agent, or Firm* — Birch, Stewart, Kolasch & Birch, LLP

(57) ABSTRACT

A display device according to an embodiment of the present disclosure can include a display panel configured to display an image, a polarizing plate over the display panel, a front member over the polarizing plate, and a protection member over the front member. The protection member can include at least two protection films and an adhesive layer disposed between the at least two protection films.

18 Claims, 4 Drawing Sheets

DISPLAY DEVICE CAPABLE OF PREVENTING WHITENING PHENOMENON FROM OCCURRING DURING FOLDING BY REDUCING STRESS OF PROTECTION MEMBER

CROSS-REFERENCE TO RELATED APPLICATION

The present application claims priority to Korean Patent Application No. 10-2021-0189617 filed on Dec. 28, 2021, the entire contents of which are hereby expressly incorporated by reference into the present application.

BACKGROUND

Field of the Disclosure

The present disclosure relates to a display device with an improved rigidity against an external force and improved folding characteristics.

Discussion of the Related Art

Recently, with the development of multimedia, the importance of a display device has been increased. In response to this demand, display devices such as a liquid crystal display device and an organic electroluminescent display device have been commercialized. Among these display devices, the organic electroluminescent display device is widely used because it has advantages such as high response speed, high luminance and wide viewing angles.

Furthermore, in recent years, various flexible display devices have been developed. For example, rollable, foldable, and stretchable display devices are being developed. However, these devices are repeatedly folded, rolled, or stretched, so that defects can occur due to stress.

SUMMARY OF THE DISCLOSURE

Accordingly, the present disclosure is directed to a display device that substantially obviates one or more of the problems due to limitations and disadvantages described above.

More specifically, the present disclosure is to provide a display device capable of preventing a whitening phenomenon from occurring during folding by reducing a stress of a protection member.

Additional features and aspects will be set forth in the description that follows, and in part will be apparent from the description, or can be learned by practice of the present disclosure provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, a display device according to an embodiment of the present disclosure includes a display panel configured to display an image, a polarizing plate over the display panel, a front member over the polarizing plate, and a protection member over the front member, wherein the protection member includes at least two protection films and an adhesive layer disposed between the at least two protection films.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION OF THE EMBODIMENTS

Figure 1:
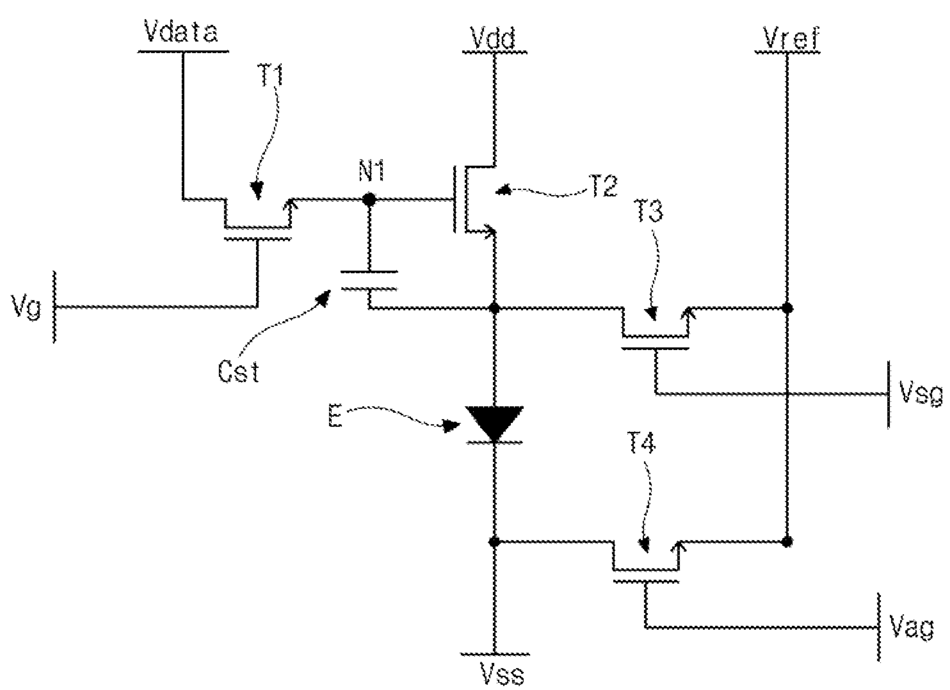
FIG. 1 is a circuit diagram of a sub-pixel of an organic electroluminescent display device according to an embodiment of the present disclosure.

Advantages and features of the present disclosure and methods for achieving them will be made clear from embodiments described in detail below with reference to the accompanying drawings. The present disclosure can, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in this disclosure are used, other parts can be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts can be located between the two parts.

In describing a temporal relationship, for example, when a temporal predecessor relationship is described as being "after," "subsequent," "next to," "prior to," or the like, unless "immediately" or "directly" is not used, cases that are not continuous can also be included.

Although the terms such as first, second, and the like are used to describe various components, these components are not substantially limited by these terms. These terms are used only to distinguish one component from another component. Therefore, a first component described below can substantially be a second component within the technical spirit of the present disclosure.

In describing components of the present disclosure, terms such as first, second, A, B, (a), (b) and the like can be used. These terms are only for distinguishing the components from other components, and an essence, order, order, or number of the components is not limited by the terms. Further, when it is described that a component is "connected", "coupled" or "contact" to another component, the component can be directly connected or contact the another component, but it should be understood that other component can be "interposed" between the components or the components can be "connected," "coupled," or "contact" through one or more other components.

The term "at least one" should be understood to include all possible combinations from one or more related items. For example, the meaning of "at least one of the first, second, and third items" means 2 of the first, second, and third items as well as each of the first, second, or third items. It can mean a combination of all items that can be presented from more than one.

As used herein, the term "apparatus" or "device" can include a display apparatus such as a liquid crystal module (LCM) including a display panel and a driving unit for driving the display panel, and an organic light emitting display module (OLED module). Further, the term "apparatus" can further include a notebook computer, a television, a computer monitor, a vehicle electric apparatus including an apparatus for a vehicle or other type of vehicle, and a set electronic apparatus or a set apparatus such as a mobile electronic apparatus of a smartphone or an electronic pad, etc., which are a finished product (complete product or final product) including LCM and OLED module.

Accordingly, the apparatus or device in the present specification can include the display apparatus itself such as the LCM, the OLED module, etc., and the application product including the LCM, the OLED module, or the like, or the set apparatus, which is the apparatus for end users.

In addition, in some embodiments, the LCM or the OLED module composed of a display panel and a driving unit can be expressed as a "display apparatus," and an electronic apparatus as a finished product including the LCM and the OLED module can be distinguished and expressed as a "set apparatus." For example, the display apparatus can include the liquid crystal (LCD) or the organic light emitting (OLED) display panel, and a source PCB that is a control unit for driving the display panel. The set apparatus can further include a set PCB, which is a set controller electrically connected to the source PCB to drive the entire set apparatus.

All types of display panels such as the liquid crystal display panel, the organic light emitting display panel, and the electroluminescent display panel can be used for the display panel used in the embodiments of the present specification, but not limited thereto. For example, the display panel can be the display panel capable of generating sound by being vibrated by the vibrating device according to the exemplary embodiment of the present specification. The display panel applied to the display apparatus according to the embodiment of the present specification is not limited to the shape or size of the display panel. Further, all the components of each display device according to all embodiments of the present disclosure are operatively coupled and configured.

Each feature of the various embodiments of the present specification can be partially or wholly combined or combined with each other, technically various interlocking and driving are possible, and each of the embodiments can be independently implemented with respect to each other or can be implemented together in a related relationship.

Hereinafter, embodiments of the present specification will be described with reference to the accompanying drawings and examples. The scales of the components shown in the drawings have different scales from the actual ones for convenience of explanation, and thus are not limited to the scales shown in the drawings.

As the display device of the present specification, various display devices such as an organic light emitting display device, a liquid crystal display device, an electrophoretic display device, a mini LED (Light Emitting Diode) display device, and a micro LED display device can be applied, but in the following description, for convenience of explanation, an example of an organic light emitting display device will be described.

FIG. 1 is a circuit diagram of a sub-pixel of an organic electroluminescent display device according to an embodiment of the present disclosure.

Referring to FIG. 1, the organic electroluminescent display device according to the embodiment of the present disclosure can include a display area and a pad area. The display area can include a plurality of sub-pixels SP. Each sub-pixel SP can display one color in the organic electroluminescent display device. For example, each sub-pixel SP can display one of red, green, blue, and white colors. In this case, red, green, blue, and white sub-pixels SP can be defined as one pixel. The plurality of sub-pixels SP can be arranged in a matrix form on a substrate of the organic electroluminescent display device, and a plurality of lines can be disposed among the plurality of sub-pixels SP in the display area.

In addition, various lines electrically connected to the lines disposed in the display area and applying signals to light emitting elements of the organic electroluminescent display device can be disposed in the pad area as well. The lines can include, for example, a Vdd line, a Vdata line, a reference line (e.g., Vref line), a Vss line, and the like, but are not limited thereto.

Each sub-pixel SP of the organic electroluminescent display device according to the present disclosure can include a switching thin film transistor T1, a driving thin film transistor T2, a storage capacitor Cst, a sensing thin film transistor T3, an auxiliary thin film transistor T4, and a light emitting element E. Since the sub-pixel SP of the organic electroluminescent display device according to this example of the present disclosure includes four thin film transistors and one capacitor, it can be referred to as a 4T1C structure. However, the structure of the sub-pixel SP of the organic electroluminescent display device according to the present disclosure is not limited thereto. For example, the sub-pixel SP of the organic electroluminescent display device can have one of various structures such as a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors included in the sub-pixel SP can include a semiconductor layer, a gate electrode, a source electrode, and a drain electrode, and can be a P-type thin film transistor or an N-type thin film transistor. For convenience of description, FIG. 1 shows N-type thin film transistors as an example, but the present disclosure is not limited thereto.

The switching thin film transistor T1 can include a drain electrode connected to a data line (e.g., Vdata line), a source electrode connected to a first node N1, and a gate electrode connected to a gate line (e.g., Vg line). The switching thin film transistor T1 can be turned on based on a gate voltage Vg applied from a gate driving portion to the gate line, and can charge the first node N1 with a data voltage Vdata applied from a data driving portion to the data line.

The driving thin film transistor T2 can include a drain electrode connected to a high potential line (e.g., Vdd line), a source electrode connected to an anode of the light emitting element E, and a gate electrode connected to the first node N1. The driving thin film transistor T2 can be turned on when a voltage of the first node N1 is higher than a threshold voltage (Vth), and the driving thin film transistor T2 can be turned off when a voltage of the first node N1 is lower than the threshold voltage. The driving thin film transistor T2 can transmit a driving current received from the Vdd line to the light emitting element E. The light emitting element E can be an organic light emitting diode, but is not limited thereto.

The storage capacitor Cst can include an electrode connected to the first node N1 and an electrode connected to the source electrode of the driving thin film transistor T2. The storage capacitor Cst maintains a potential difference between the gate electrode and the source electrode of the driving thin film transistor T2 during an emission time when the light emitting element E emits a light, thereby providing a constant driving current to the light emitting element E.

The sensing thin film transistor T3 can include a drain electrode connected to the source electrode of the driving thin film transistor T2, a source electrode connected to the reference line, and a gate electrode connected to a sensing gate line (e.g., Vsg line). The sensing thin film transistor T3 can be a thin film transistor for sensing the threshold voltage of the driving thin film transistor T2.

The auxiliary thin film transistor T4 can include a drain electrode electrically connected to a cathode of the light emitting element E, a source electrode electrically connected to the reference line, and a gate electrode electrically connected to an auxiliary gate line (e.g., Vag line). The auxiliary thin film transistor T4 can be turned on in the emission time and provide a low potential voltage (e.g., Vss voltage) to the cathode of the light emitting element E.

Figure 2:
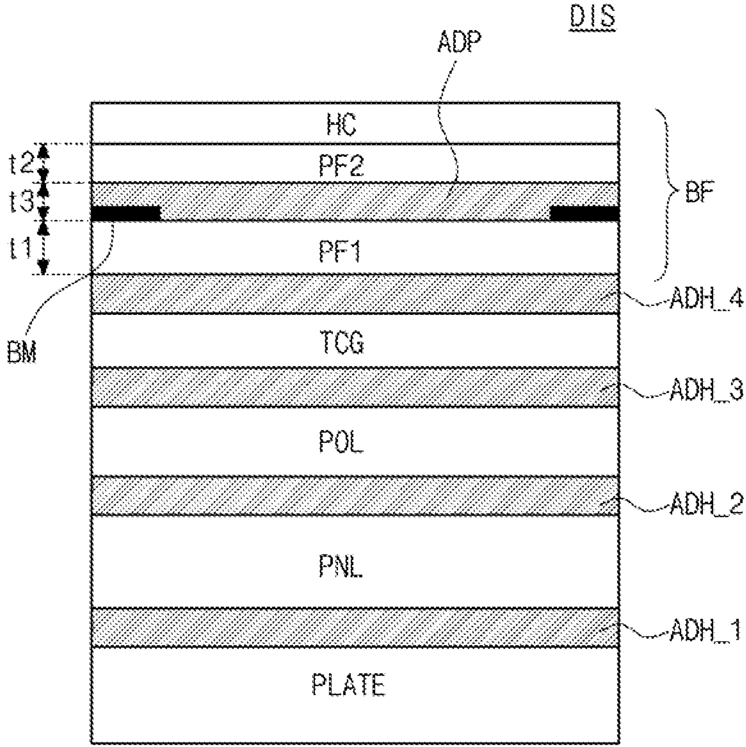
FIG. 2 is a cross-sectional view of a display device according to an embodiment of the present disclosure.

FIG. 2 is a view illustrating a structure of a display device according to an embodiment of the present disclosure.

As shown in FIG. 2, a display device DIS according to the embodiment of the present disclosure can include a back plate PLATE, a display panel PNL disposed over the back plate PLATE and displaying an image, a polarizing plate POL disposed over the display panel PNL and preventing reflection of the external light incident from the outside, a front member TCG disposed over the polarizing plate POL, and a protection member BF disposed over the front member TCG.

The display panel PNL can be attached to the back plate PLATE by a first adhesive ADH_1, the polarizing plate POL can be attached to the display panel PNL by a second adhesive ADH_2, and the front member TCG can be attached to the polarizing plate POL by a third adhesive ADH_3. In addition, the protection member BF can be attached to the front member TCG by a fourth adhesive ADH_4.

Figure 3:
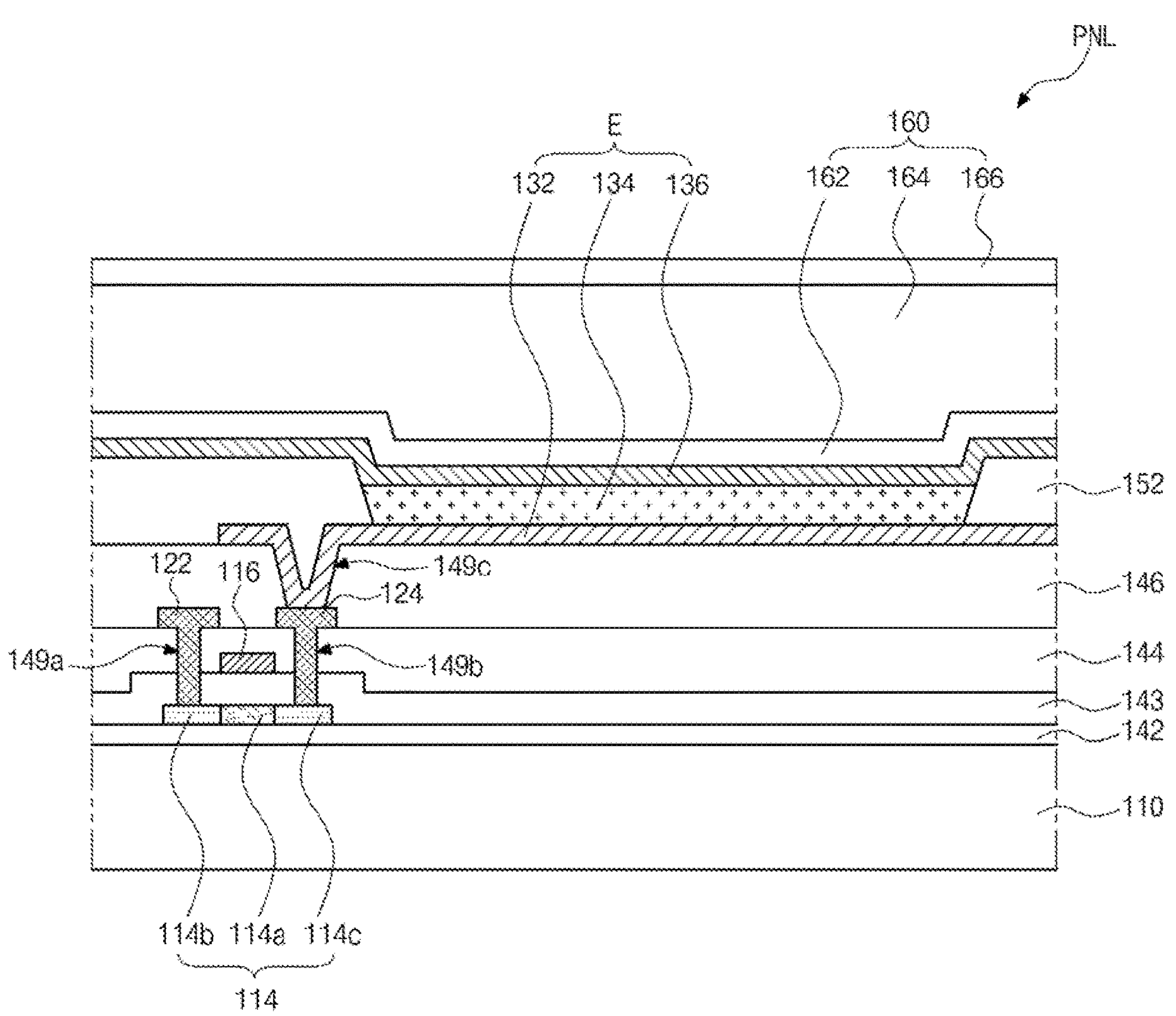
FIG. 3 is a cross-sectional view of a display panel according to an embodiment of the present disclosure.

FIG. 3 is a cross-sectional view of a display panel according to an embodiment of the present disclosure. Although the display panel PNL substantially includes a plurality of sub-pixels, only one sub-pixel is illustrated in the figure for convenience of description.

As shown in FIG. 3, a thin film transistor T can be disposed on a substrate 110. Various thin film transistors such as a switching thin film transistor, a driving thin film transistor, a sensing thin film transistor, and an auxiliary thin film transistor can be disposed in each sub-pixel of the display panel PNL, but only one thin film transistor T is shown in the figure for convenience of description. Accordingly, the thin film transistor T can be one of the switching thin film transistor, the driving thin film transistor, the sensing thin film transistor, and the auxiliary thin film transistor.

Since the switching thin film transistor, the driving thin film transistor, the sensing thin film transistor, and the auxiliary thin film transistor can all have the same structure, the structure of all the thin film transistors can be expressed with one thin film transistor T.

The thin film transistor T can include a semiconductor layer 114 formed on a buffer layer 142 formed on the substrate 110, a gate insulating layer 143 disposed on the buffer layer 142 to cover the semiconductor layer 114, a gate electrode 116 disposed on the gate insulating layer 143, an inter-layered insulating layer 144 disposed on the gate insulating layer 143 to cover the gate electrode 116, and a source electrode 122 and a drain electrode 124 disposed on the inter-layered insulating layer 144.

The substrate 110 can include a first base film 110*a*, a second base film 110*b*, and an inorganic inter-layered insulating layer 110*c* interposed between the first base film 110*a* and the second base film 110*b*. The first base film 110*a* and the second base film 110*b* can be made of a foldable transparent plastic material. For example, the first base film 110*a* and the second base film 110*b* can include polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC). The substrate 110 of the present disclosure is not limited to such a flexible material, but can be formed of a foldable thin glass.

The buffer layer 142 can protect the thin film transistor T formed in a subsequent process from impurities such as alkali ions leaking from the substrate 110 or block moisture or the like that can penetrate from the outside. The buffer layer 142 can be configured with a single layer made of silicon oxide (SiOx) or silicon nitride (SiNx) or multi layers thereof.

The semiconductor layer 114 can be formed of an amorphous semiconductor such as amorphous silicon (a-Si), a crystalline semiconductor such as polycrystalline silicon (p-Si), or an oxide semiconductor such as indium gallium zinc oxide (IGZO), but is not limited thereto. The semiconductor layer 114 can include a channel region 114*a* at a central region and a source region 114*b* and a drain region 114*c*, which are doped regions on both sides of the channel region 114*a*. Here, the source region 114*b* can be a drain region, and the drain region 114*c* can be a source region, depending on the source and drain electrodes of the thin film transistor T.

The gate electrode 116 can be formed of a single layer or a plurality of layers made of a metal(s) such as Cr, Mo, Ta, Cu, Ti, Al, and/or an Al alloy, but is not limited thereto.

The inter-layered insulating layer 144 can configured with a single layer or a plurality of layers made of an organic material such as photoacrylic or made of an inorganic material such as SiNx or SiOx. Alternatively, the inter-layered insulating layer 144 can be configured with a plurality of layers of an organic material layer and an inorganic material layer.

The source electrode 122 and the drain electrode 124 can be formed of a single layer or a plurality of layers made of a metal(s) such as Cr, Mo, Ta, Cu, Ti, Al, and/or an Al alloy, but is limited thereto.

The source electrode 122 and the drain electrode 124 can be in ohmic contact with the source region 114*b* and the drain region 114*c* of the semiconductor layer 114 through a first contact hole 149*a* and a second contact hole 149*b* formed in the gate insulating layer 143 and the inter-layered insulating layer 144, respectively.

A bottom shield metal layer can be disposed on the substrate 110 and below the semiconductor layer 114, so that the bottom shield metal layer can be disposed between the substrate 110 and the semiconductor layer 114. The bottom shield metal layer can be disposed between the substrate 110. The bottom shield metal layer can serve to minimize a back channel phenomenon caused by charges trapped at the substrate 110 to prevent an after-image or a deterioration of transistor performance. The bottom shield metal layer can be configured with a single layer or a plurality of layers using Ti, Mo and/or an alloy of Ti and Mo, but is not limited thereto.

A passivation layer 146 can be formed on the substrate 110 having the thin film transistor T thereon. The passivation layer 146 can be formed of an organic material such as photoacrylic, but is not limited thereto. For example, the passivation layer 146 can be configured with a plurality of layers including an inorganic layer and an organic layer. A third contact hole 149*c* can be formed in the passivation layer 146.

An anode electrode 132 can be formed on the passivation layer 146 and electrically connected to the drain electrode 124 of the thin film transistor T through the third contact hole 149*c*, so that an image signal from the outside can be applied to the anode electrode 132. The anode electrode 132 can be made of a single layer or a plurality of layers using a metal(s) such as Ca, Ba, Mg, Al, and Ag and/or an alloy thereof. The anode electrode 132 is not limited to the above materials.

A bank layer 152 can be formed at a boundary of each sub-pixel SP on the passivation layer 146. The bank layer 152 can be a separation wall defining the sub-pixel SP. For example, the bank layer 152 can partition the sub-pixels SP to prevent a light of a specific color output from an adjacent sub-pixel from being mixed and output to the outside. The bank layer 152 can expose the anode electrode 132 in each sub-pixel SP.

A light emitting layer 134 can be formed on the anode electrode 132. Specifically, the light emitting layer 132 can be formed on the anode electrode 132 exposed by the bank layer 152 and also formed on a portion of an inclined surface of the bank layer 152. The light emitting layer 134 can be an R-emitting layer which is formed in an R sub-pixel and emits a red light, a G-emitting layer which is formed in a G sub-pixel and emits a green light, or a B-emitting layer which is formed in a B sub-pixel and emits a blue light. Alternatively, the light emitting layer 134 can be a W-emitting layer that emits a white light. The light emitting layer 134 can be an organic light emitting layer. Alternatively, the light emitting layer 134 can be an inorganic light emitting layer such as a nano-sized material layer, a quantum dot, a light emitting layer of a micro LED, or a light emitting layer of a mini LED. However, the present disclosure is not limited thereto.

The light emitting layer 134 can include an emission layer. The light emitting layer 134 can further include an electron injection layer and a hole injection layer for respectively injecting electrons and holes into the emission layer. In addition, the light emitting layer can further include an electron transport layer and a hole transport layer for respectively transporting the injected electrons and holes to the emission layer.

Moreover, the light emitting layer can further include an electron blocking layer and a hole blocking layer. However, the present disclosure is not limited thereto.

A cathode electrode 136 can be formed over the entire display device on the light emitting layer 134. The cathode electrode 136 can also be formed on the bank layer 152. The cathode electrode 132 can be in contact with a top surface and the inclined surface of the bank layer 152. The cathode electrode 136 can be made of a transparent conductive material such as indium tin oxide (ITO) or indium zinc oxide (IZO), or a thin metal through which a visible light is transmitted, but is not limited thereto.

The anode electrode 132, the light emitting layer 134, and the cathode electrode 136 can form the light emitting element E and output a light having a specific wavelength as a signal is applied from the outside.

An encapsulation layer 160 can be formed on the cathode electrode 136. The encapsulation layer 160 can include a first encapsulation layer 162 made of an inorganic material, a second encapsulation layer 164 made of an organic material, and a third encapsulation layer 166 made of an inorganic material. The inorganic material can include, but is not limited to, SiNx or SiOx. In addition, the organic material can include, but is not limited to, polyethylene terephthalate, polyethylene naphthalate, polycarbonate, polyimide, polyethylene sulfonate, polyoxymethylene, polyarylate, or a mixture thereof.

Referring to FIG. 2, the back plate PLATE can be attached to a bottom surface of the display panel PNL. In a foldable display device DIS, since the substrate of the display panel PNL is formed of a plastic material, a plastic substrate can be disposed on a support substrate such as glass, and then the manufacturing process can be performed, so that various components such as the thin film transistors and the light emitting element can be formed on the plastic substrate. After the display panel PNL is manufactured, the support substrate can be separated from the display panel PNL. If the support substrate is separated, a component for supporting the plastic substrate can be needed. Therefore, in the present disclosure, the back plate PLATE can be disposed on the bottom surface of the display panel PNL to support the substrate of the display panel PNL.

In addition the back plate PLATE can be formed of a rigid material to protect the display panel PNL from the external impacts and also to serve as a heat dissipation member that emits heat generated when the display panel PNL is driven. Further, the back plate PLATE can be formed of a material having relatively high electrical conductivity to discharge static electricity generated in the display device DIS to the outside. The back plate PLATE can include one or more of copper (Cu), copper foam (Cu foam), stainless steel, graphite, and polyethylene terephthalate (PET), but is not limited thereto.

The polarizing plate POL can be disposed on the display panel PNL. The polarizing plate POL can prevent reflection of light incident from the outside to improve visibility of the display device DIS. The polarizing plate POL can transmit only light in a specific polarization direction among the external light incident from the outside and absorb the remaining light. Light transmitted by the polarizing plate POL can be reflected at the display panel PNL and then be incident onto the polarizing plate POL again. At this time, since the polarization direction of the reflected external light is changed, the light incident onto the polarizing plate POL again can be absorbed by the polarizing plate POL and is not output to the outside, so that the reflection of the external light can be prevented.

The polarizing plate POL can be a circular polarizing plate. In this case, the polarizing plate POL can include a linear polarizer and a retardation film of $\lambda/4$ between the linear polarizer and the display panel PNL.

The polarizing plate POL can include a polymer film mainly composed of a polyvinyl alcohol-based (PVA-based) resin containing iodine or a dichroic dye and protective films on both sides of the polymer film. At this time, the polymer film can be uniaxially stretched, so that the iodine or the dichroic dye can be oriented in one direction. Alternatively, the polarizing plate POL can be formed of a material other than the PVA-based resin. For example, an O-type polarizer in which a liquid crystal composition containing a dichroic material and a liquid crystal compound is oriented in a predetermined direction or an E-type polarizer in which a lyotropic liquid crystal is aligned in a predetermined direction can be used for the polarizing plate POL.

The protective film of the polarizing plate POL can be a transparent film without retardation to protect the polymer film from the external moisture or contamination. The protective film can be formed of triacetyl cellulose (TAC), polyethylene terephthalate (PET), cycloolefin polymer (COP), or a combination thereof, but is not limited thereto.

The front member TCG can be attached to a top surface of the polarizing plate POL. The front member TCG can transmit the image of the display panel PNL to the outside and protect the display panel PNL from the external impacts and external environment or stress. Since the front member TCG is formed to a thickness of several tens of μm, the front member TCG can be damaged by a small external impact or continuous folding.

The protection member BF can be attached to a top surface of the front member TCG and protect the front member TCG from the external impacts or compressive stress and tensile stress by continuous folding. In addition, when the front member TCG is damaged by the external impacts or stress to generate glass powder, the protection member BF can prevent the glass powder from scattering to the outside.

As described above, the display device DIS can further include the adhesives. More specifically, the adhesives can include the first adhesive ADH_1 for attaching the display panel PNL to the back plate PLATE, the second adhesive ADH_2 for attaching the polarizing plate POL to the display panel PNL, the third adhesive ADH_3 for attaching the front member TCG to the polarizing plate POL, and the fourth adhesive ADH_4 for attaching the protection member BF to the front member TCG Therefore, the first adhesive ADH_1 can be disposed between the back plate PLATE and the display panel PNL, the second adhesive ADH_2 can be disposed between the display panel PNL and the polarizing plate POL, the third adhesive ADH_3 can be disposed between the polarizing plate POL and the front member TCG and the fourth adhesive ADH_4 can be disposed between the front member TCG and the protection member BF. The first adhesive ADH_1, the second adhesive ADH_2, the third adhesive ADH_3, and the fourth adhesive ADH_4 can be formed of optically clear adhesive (OCA).

The OCA can be formed in the form of a double-sided tape, and release films can be attached to both sides thereof, respectively. During bonding, the bonding objects can be bonded by attaching the bonding objects to both sides of the OCA in a state in which the release films are peeled off.

The protection member BF can be disposed on the front member TCG and can include a first protection film PF1, a second protection film PF2, and an adhesive layer ADP disposed between the first protection film PF1 and the second protection film PF2. Here, the first protection film PF1 can be disposed between the front member TCG and the second protection film PF2. In addition, a coating layer HC can be further formed on the second protection film PF2. Here, the protection member BF can further include the coating layer HC.

The first protection film PF1 and the second protection film PF2 can be formed using a transparent film such as polyethylene terephthalate (PET), but is not limited thereto. Alternatively, the first protection film PF1 and the second protection film PF2 can be formed using triacetyl cellulose (TAC), cycloolefin polymer (COP), or a combination thereof.

The adhesive layer ADP can be formed using pressure sensitive adhesive (PSA) made of acrylic, vinyl, silicone, and/or rubber, but is not limited thereto. The adhesive layer ADP can be configured in the form of a semi-solid tape with release papers attached to both sides. The release papers can be removed and the first protection film PF1 and the second protection film PF2 can be in contact with the both sides of the adhesive layer ADP. Then, by applying pressure to the first and second protection films PF1 and PF2 in contact with the adhesive layer ADP, the first and second protection films PF1 and PF2 can be attached to each other through the adhesive layer ADP.

However, the adhesive layer ADP of the present disclosure is not limited to this configuration, and various adhesive materials can be used. For example, OCA can be used as the adhesive layer ADP of the present disclosure.

The protection member BF can be formed to a thickness of about 90 μm, but is not limited thereto. When the display device DIS according to the embodiment of the present disclosure is an in-folding display device that is folded in a direction in which the image is displayed, for example, the first protection film PF1 side, for example, when the back plate PLATE of the folded display device DIS is exposed to the outside, the thickness t1 of the first protection film PF1 can be set to about 45-55 μm, for example, 50 μm, but is not limited thereto. In addition, the thickness t2 of the second protection film PF2 can be set to about 20-30 μm, for example, 25 μm, but is not limited thereto. Further, the thickness of the adhesive layer ADP can be set to about 10-20 μm, for example, 15 μm, but is not limited thereto.

Alternatively, when the display device DIS according to the embodiment of the present disclosure is an out-folding display device that is folded in a direction opposite to the direction in which the image is displayed, for example, the second protection film PF2 side, for example, when the coating layer HC of the folded display device DIS is exposed to the outside, the thickness t0 of the first protection film PF1 can be set to about 20-30 μm, for example, 25 μm, but is not limited thereto. In addition, the thickness t2 of the second protection film PF2 can be set to about 45-55 μm, for example, 50 μm, but is not limited thereto. Further, the thickness of the adhesive layer ADP can be set to about 10-20 μm, for example, 15 μm, but is not limited thereto.

As described above, the reason that the thicknesses of the first protection film PF1 and the second protection film PF2 are different according to the in-folding and the out-folding is because the magnitude of the stress is different according to the folding direction. In general, when the display device DIS is folded, the compressive stress is greater than the tensile stress. In addition, as the thickness of the protection film increases, the stress during folding increases. Accordingly, since the stress applied to the second protection film PF2 is greater than the stress applied to the first protection film PF1 during in-folding, the thickness of the second protection film PF2 can be configured to be thinner than the thickness of the first protection film PF1, so that the stress on the folding side can be minimized, thereby minimizing the whitening phenomenon due to the stress.

On the contrary, since the stress applied to the first protection film PF1 is greater than the stress applied to the second protection film PF2 during out-folding, the thickness of the first protection film PF1 can be configured to be thinner than the thickness of the second protection film PF2, so that the stress on the folding side can be minimized, thereby minimizing the whitening phenomenon due to the stress.

The first protection film PF1 and the second protection film PF2 can have a modulus of about 4 GPa, and the adhesive layer ADP can have a modulus of 1-10 MPa.

In addition, the first protection film PF1 can be formed using a film with no retardation or a low retardation film, and the second protection film PF2 can be formed using a film having a plane direction retardation Ri of 6500 nm or more. In addition, when the protection member BF is composed of three or more protection films, the outermost protection film among three or more protection films can include a film having a plane direction retardation of 6500 nm or more.

As described above, the outermost protection film of the display device DIS can be configured to include the film having a plane direction retardation of 6500 nm or more, so that image quality defects such as rainbow spots or rainbow mura can be prevented.

The second protection film PF1 can include a UV absorber and/or a light stabilizer. As the UV absorber, 2-methylphenyl 4-methylbenzoate can be used, but is not limited thereto. Alternatively, benzotriazol, benzophenone, oxalic acid anilide, cyanoacrylate, or the like can be used as the UV absorber. In addition, the light stabilizer can use hindered amine light stabilizer of Tinuvin XXX series and can absorb alkyl radical and peroxide radical generated by UV exposure to stop a chain reaction, so that UV rays can be blocked.

Since the UV absorber and/or the light stabilizer are included, UV rays incident from the outside can be blocked by the second protection film PF2, so that the adhesives ADH_1, ADH_2, ADH_3, and ADH_4 or the adhesive layer ADP can be prevented from being overcured to cause cracks.

In addition, when the protection member BF includes three or more protection films, the outmost protection film can include the UV absorber and/or the light stabilizer.

As described above, in the display device DIS according to the present disclosure, the protection member BF can be configured to include the first protection film PF1, the second protection film PF2, and the adhesive layer ADP between the first protection film PF1 and the second protection film PF2, so that the following effects can be obtained.

The protection member BF can be configured to include a single layer of a protection film. For example, the protection member BF can be a single protection film. In this case, the thickness of the protection film can be much thicker than the thicknesses of the first and second protection films PF1 and PF2 of the present disclosure. For example, when the protection member BF is used as a single protection member, the thickness of the protection member BF can be similar to the total thickness of the first protection film PF1, the adhesive layer ADP, and the second protection film PF2 of the present disclosure. As the thickness of the protection film increases, the compressive stress and the tensile stress can increase when the display device DIS is folded and unfolded. The stresses can crystallize the molecular structure of the protection film and cause whitening phenomenon in the protection film.

The best way to prevent the whitening phenomenon can be to reduce the thickness of the protection film of the protection member BF. However, as the thickness of the protection film of the protection member BF is decreased, the impact of the display device against the external force can be reduced.

On the other hand, as in the present disclosure, in the case that the protection member BF is configured to include the first protection film PF1, the second protection film PF2, and the adhesive layer ADP between the first protection film PF1 and the second protection film PF2, the compressive stress and the tensile stress applied to the protection member BF when the display device DIS is repeatedly folded and unfolded can be reduced.

Figure 4A:
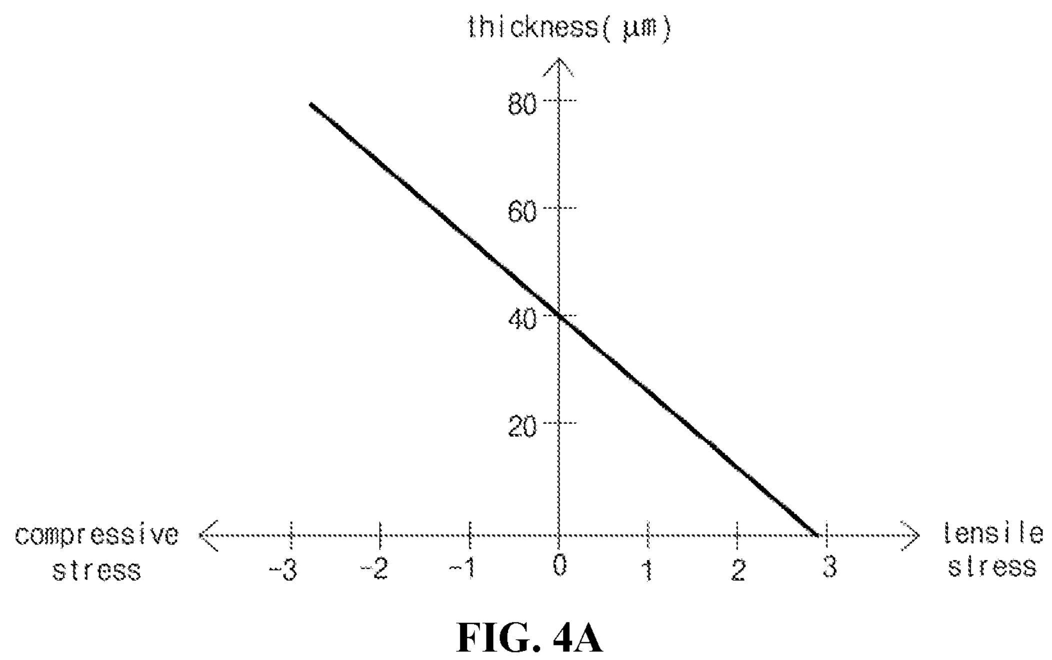
FIG. 4A is a graph showing the stress according to the thickness in the case of in-folding when the protection member is formed of a single protection film.
Figure 4B:
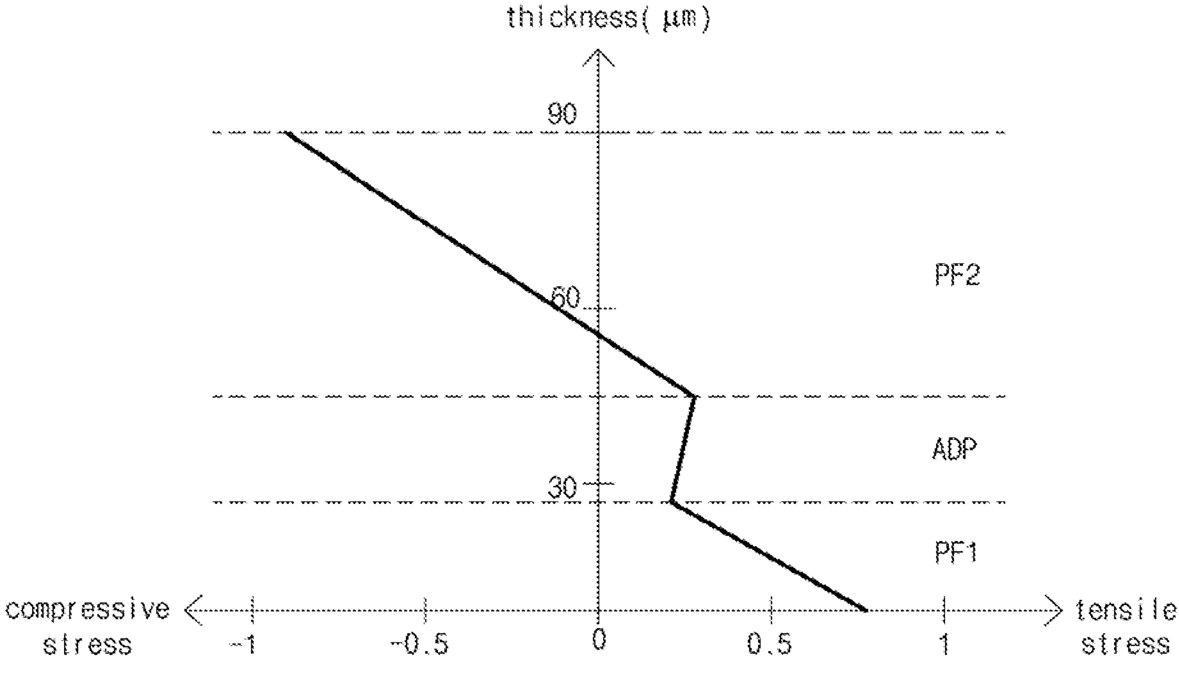
FIG. 4B is a graph showing the stress according to the thickness in the case of in-folding when the protection member is formed of a plurality of protection films.

FIG. 4A is a graph showing the stress according to the thickness when the protection member BF configured as a structure of a single protection film having a thickness of 80 μm is in-folded, and FIG. 4B is a graph showing the stress according to the thickness when the protection member BF according to the embodiment of the present disclosure is in-folded in which the thicknesses of the first protection film PF1, the adhesive layer ADP, and the second protection film PF2 of the protection member BF are 25 μm, 15 μm, and 50 μm, respectively. Here, x-axis can show the compressive stress and the tensile stress, and y-axis can show the thickness from the bottom surface to the top surface of the protection member BF.

As shown in FIG. 4A, in the case that the protection member BF is formed of a single-layer protection film, when the display device DIS is in-folded, the compressive stress can increase toward the upper direction (i.e., the in-folding side) in the middle of the protection member BF, and the compressive stress on the top surface of the protection member BF can be about −2.7. In addition, the tensile stress can increase toward the lower direction (i.e., the opposite side of the in-folding) in the middle of the protection member BF, and the tensile stress on the bottom surface of the protection member BF can be about 2.7.

As shown in FIG. 4B, in the case of the protection member BF according to the present disclosure, when the display device DIS is in-folded, the tensile stress can increase toward the bottom surface of the protection member BF and the compressive stress can increase toward the top surface of the protection member BF. However, in the case of the protection member BF according to the present disclosure, the adhesive layer ADP serves to relive the stress, so that the stress on the top surface of the second protection film PF2 can be about −0.7, and the stress on the bottom surface of the first protection film PF1 can be about 0.7.

Accordingly, in the display device DIS according to the present disclosure, the stress can be reduced to about ¼ compared to the protection member BF formed of a single film, and thus the whitening phenomenon of the protection films PF1 and PF2 due to the stress can be minimized.

Referring to FIG. 2, a black matrix BM can be formed along an edge of the top surface of the first protection film PF1. The black matrix BM can cover the lower lines disposed in an outer edge region of the display panel PNL. In this case, the black matrix BM can be formed of a metal oxide such as CrOx, a black resin, or black ink, but is not limited thereto.

The coating layer HC can be formed on the second protection film PF2 to protect the display device DIS from scratches. In this case, the coating layer HC can be formed of an organic material such as a urethane acrylic resin, a methacrylic resin, or a silsesquioxane compound, but is not limited thereto.

The protection member BF can further include a functional layer. The functional layer can be disposed on the coating layer or formed by surface treatment of the coating layer. The functional layer can include one or more of an anti-finger print layer, an anti-contamination layer, and an anti-glare layer, but is not limited thereto.

As described above, in the display device DIS according to the embodiment of the present disclosure, the protection member BF can be configured to include two protection films PF1 and PF2 and the adhesive layer ADP therebetween, so that the stress applied to the protection member BF when the display device DIS is folded can be greatly reduced. As a result, it is possible to prevent the whitening phenomenon from occurring in the protection member BF due to the folding, thereby improving folding characteristics of the display device DIS.

In addition, in the display device DIS according to the embodiment of the present disclosure, since the thickness of the protection member BF can be maintained at a predetermined thickness or more, the rigidity against the external force and the folding characteristics can be improved.

Figure 5:
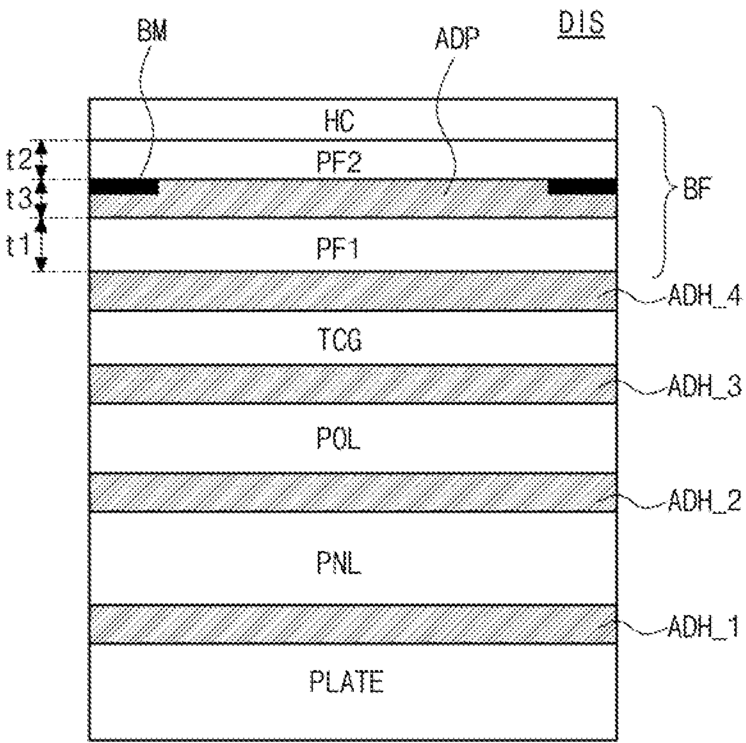
FIG. 5 is a cross-sectional view of a display device according to another embodiment of the present disclosure.

FIG. 5 is a view illustrating a structure of a display device DIS according to another embodiment of the present disclosure. Here, description of the same configurations as the embodiment shown in FIG. 2 will be omitted or simplified, and different structures will be described in detail.

As shown in FIG. 5, the display device DIS according to another embodiment of the present disclosure can include a back plate PLATE, a display panel PNL disposed over the back plate PLATE and displaying an image, a polarizing plate POL disposed over the display panel PNL and preventing reflection of the external light incident from the outside, a front member TCG disposed over the polarizing plate POL, and a protection member BF disposed over the front member TCG.

The display panel PNL can be attached to the back plate PLATE by a first adhesive ADH_1, the polarizing plate POL can be attached to the display panel PNL by a second adhesive ADH_2, and the front member TCG can be attached to the polarizing plate POL by a third adhesive ADH_3. In addition, the protection member BF can be attached to the front member TCG by a fourth adhesive ADH_4.

The protection member BF can be attached to a top surface of the front member TCG and protect the front member TCG from the external impacts or compressive stress and tensile stress by continuous folding. In addition, when the front member TCG is damaged by the external impacts or stress to generate glass powder, the protection member BF can prevent the glass powder from scattering to the outside.

The protection member BF can be disposed on the front member TCG and can include a first protection film PF1, a second protection film PF2, and an adhesive layer ADP disposed between the first protection film PF1 and the second protection film PF2. Here, the first protection film PF1 can be disposed between the front member TCG and the second protection film PF2. In addition, a black matrix BM can be formed along an edge of a bottom surface of the second protection film PF2, and a coating layer HC can be further formed on the second protection film PF2. Here, the protection member BF can further include the coating layer HC.

The first protection film PF1 and the second protection film PF2 can be formed using a transparent film such as polyethylene terephthalate (PET), but is not limited thereto. Alternatively, the first protection film PF1 and the second protection film PF2 can be formed using triacetyl cellulose (TAC), cycloolefin polymer (COP), or a combination thereof.

The adhesive layer ADP can be formed using pressure sensitive adhesive (PSA) made of acrylic, vinyl, silicone, and/or rubber. However, the adhesive layer ADP of the present disclosure is not limited to this configuration, and various adhesive materials can be used. For example, OCA can be used as the adhesive layer ADP of the present disclosure.

The black matrix can block light output from the display panel PNL from leaking to the edge of the display device DIS. The black matrix BM can be formed of a metal oxide such as CrOx, a black resin, or black ink.

The protection member BF can be formed to a thickness of about 90 μm, but is not limited thereto. When the display device DIS according to another embodiment of the present disclosure is an in-folding display device, for example, when the back plate PLATE of the folded display device DIS is exposed to the outside, a thickness t2 of the second protection film PF2 can be set to be smaller than a thickness t1 of the first protection film PF1, for example, $t2<t1$, thereby preventing the stress from increasing during folding.

Alternatively, when the display device DIS according to another embodiment of the present disclosure is an out-folding display device, for example, when the coating layer HC of the folded display device DIS is exposed to the outside, a thickness t1 of the first protection film PF1 can be set to be smaller than a thickness t2 of the second protection film PF2, for example, $t1<t2$, thereby preventing the stress from increasing during folding.

In the display device DIS according to another embodiment of the present disclosure, the stress during folding can be reduced without decreasing the thickness of the protection member BF, so that the folding characteristics of the display device DIS can be improved.

Figure 6:
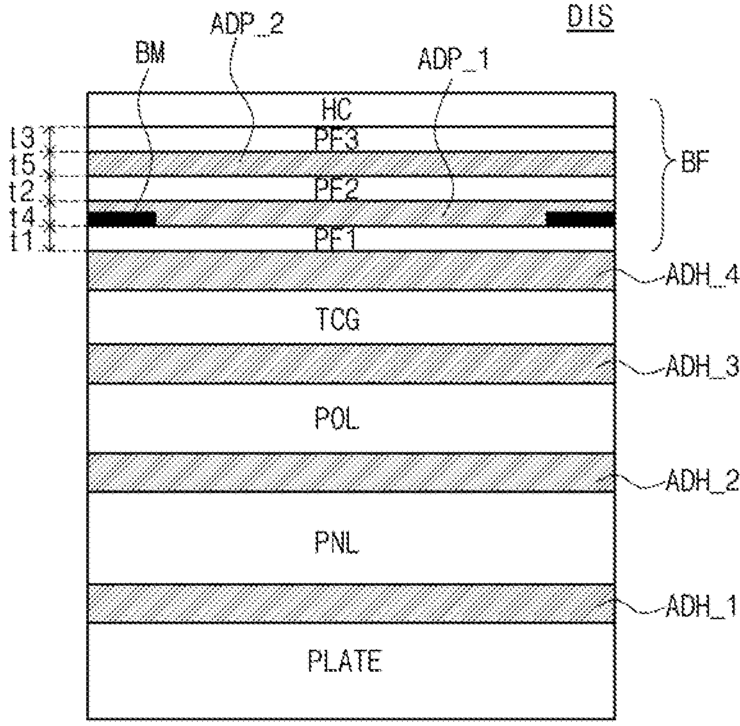
FIG. 6 is a cross-sectional view of a display device according to another embodiment of the present disclosure.

FIG. 6 is a view illustrating a structure of a display device DIS according to another embodiment of the present disclosure. Here, description of the same configurations as the embodiment shown in FIG. 2 will be omitted or simplified, and different structures will be described in detail.

As shown in FIG. 6, the display device DIS according to another embodiment of the present disclosure can include a back plate PLATE, a display panel PNL disposed over the back plate PLATE and displaying an image, a polarizing plate POL disposed over the display panel PNL and preventing reflection of the external light incident from the outside, a front member TCG disposed over the polarizing plate POL, and a protection member BF disposed over the front member TCG.

The display panel PNL can be attached to the back plate PLATE by a first adhesive ADH_1, the polarizing plate POL can be attached to the display panel PNL by a second adhesive ADH_2, and the front member TCG can be attached to the polarizing plate POL by a third adhesive ADH_3. In addition, the protection member BF can be attached to the front member TCG by a fourth adhesive ADH_4.

The protection member BF can be attached to a top surface of the front member TCG and protect the front member TCG from the external impacts or compressive stress and tensile stress by continuous folding. In addition, when the front member TCG is damaged by the external impacts or stress to generate glass powder, the protection member BF can prevent the glass powder from scattering to the outside.

The protection member BF can be disposed on the front member TCG and can include a first protection film PF1, a second protection film PF2, a third protection film PF3, a first adhesive layer ADP_1 disposed between the first protection film PF1 and the second protection film PF2, a second adhesive layer ADP_2, and a coating layer HC on the third protection film PF3. In addition, a black matrix BM can be formed along an edge on at least one of a top surface of the first protection film PF1, a top surface or a bottom surface of the second protection film PF2, and a bottom surface of the third protection film PF3.

As described above, in the embodiment of the present disclosure, the protection member BF can be configured to include three protection films PF1, PF2, and PF3 and two adhesive layers ADP_1 and ADP_2. However, the present disclosure is not limited thereto. Alternatively, the protection member BF can be configured to include four or more protection films and three or more adhesive layers.

The first protection film PF1, the second protection film PF2, and the third protection film PF3 can be formed using a transparent film such as polyethylene terephthalate (PET), but is not limited thereto. Alternatively, the first protection film PF1, the second protection film PF2, and the third protection film PF3 can be formed using triacetyl cellulose (TAC), cycloolefin polymer (COP), or a combination thereof.

The first adhesive layer ADP_1 and the second adhesive layer ADP_2 can be formed using pressure sensitive adhesive (PSA) made of acrylic, vinyl, silicone, and/or rubber. However, the present disclosure is not limited thereto, and various adhesive materials can be used. For example, OCA can be used as the adhesive layers ADP_1 and ADP_2 of the present disclosure.

The protection member BF can be formed to a thickness of about 90 μm, but is not limited thereto. When the display device DIS according to another embodiment of the present disclosure is an in-folding display device, for example, when the back plate PLATE of the folded display device DIS is exposed to the outside, thicknesses of the protection films PF1, PF2, and PF3 can be thinner, i.e., t1>t2>t3, toward the upper portion, for example, from the first protection film PF1 to the third protection film PF3. Alternatively, when the display device DIS according to another embodiment of the present disclosure is an out-folding display device, for example, when the coating layer HC of the folded display device DIS is exposed to the outside, thicknesses of the protection films PF1, PF2, and PF3 can be thinner, i.e., t3>t2>t1, toward the lower portion, for example, from the third protection film PF3 to the first protection film PF1. Accordingly, it is possible to prevent an increase in the stress during folding.

Thicknesses t4 and t5 of the first and second adhesive layers ADP_1 and ADP_2 can be the same, i.e., t4=t5. Alternatively, the thicknesses t4 and t5 of the first and second adhesive layers ADP_1 and ADP_2 can be different from each other.

In the display device DIS according to another embodiment of the present disclosure, the stress during folding can be reduced without decreasing the thickness of the protection member BF, so that the folding characteristics of the display device DIS can be improved.

The display device according to the embodiments of the present disclosure can be described as follows.

A display device according to an embodiment of the present disclosure can include a display panel displaying an image, a polarizing plate over the display panel, a front member over the polarizing plate, and a protection member over the front member. The protection member includes at least two protection films and an adhesive layer disposed between the at least two protection films.

According to some embodiments of the display device, the display device can further include a first adhesive disposed between the display panel and the polarizing plate, a second adhesive disposed between the polarizing plate and the front member, and a third adhesive disposed between the front member and the protection member.

According to some embodiments of the display device, the first, second, and third adhesives can include an optically clear adhesive (OCA).

According to some embodiments of the display device, the adhesive layer can include an optically clear adhesive (OCA) or a pressure sensitive adhesive (PSA).

According to some embodiments of the display device, the at least two protection films can include polyethylene terephthalate.

According to some embodiments of the display device, an outermost protection film of the at least two protection films can have a plane direction retardation of 6500 nm or more.

According to some embodiments of the display device, an outermost protection film of the at least two protection films can include an ultraviolet (UV) absorber and/or a light stabilizer.

According to some embodiments of the display device, when the display device is an in-folding display device, thicknesses of the at least two protection films can become thinner toward an image-displaying surface of the display panel.

According to some embodiments of the display device, when the display device is an out-folding display device, thicknesses of the at least two protection films become thicker toward an image-displaying surface of the display panel.

According to some embodiments of the display device, the protection member can further include a black matrix disposed along an edge of a top surface or a bottom surface of one of the at least two protection films.

According to some embodiments of the display device, the protection member can further include a coating layer over the at least two protection films and a functional layer over the coating layer.

In the display device of the present disclosure, the protection member can be configured to include the plurality of protection films and an adhesive layer therebetween, so that the stress applied to the protection member is minimized or reduced when the display device is folded, thereby preventing the whitening phenomenon from occurring in the protection member.

Additionally, in the display device of the present disclosure, since the thickness of the protection member can be maintained at a predetermined thickness or more, the rigidity against the external force and the folding characteristics can be improved.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a display panel configured to display an image, the display panel being a folding display panel;

a polarizing plate over the display panel;

a front member over the polarizing plate; and a protection member over the front member, wherein the protection member includes at least three protection films and adhesive layers disposed therebetween and thicknesses of the at least three protection films gradually become thinner toward a folding direction of the display panel.

2. The display device of claim 1, further comprising:

a first adhesive disposed between the display panel and the polarizing plate;

a second adhesive disposed between the polarizing plate and the front member; and a third adhesive disposed between the front member and the protection member.

3. The display device of claim 2, wherein at least one of the first, second, and third adhesives includes an optically clear adhesive (OCA).

4. The display device of claim 1, wherein the adhesive layers include an optically clear adhesive (OCA) or a pressure sensitive adhesive (PSA).

5. The display device of claim 1, wherein the at least three protection films include polyethylene terephthalate.

6. The display device of claim 1, wherein an outermost protection film of the at least three protection films has a plane direction retardation of about 6500 nm or more.

7. The display device of claim 1, wherein an outermost protection film of the at least three protection films includes at least one of an ultraviolet (UV) absorber and a light stabilizer.

8. The display device of claim 1, wherein, when the display panel is an in-folding display panel, the thicknesses of the at least three protection films become thinner toward an image-displaying surface of the display panel.

9. The display device of claim 1, wherein, when the display panel is an out-folding display panel, the thicknesses of the at least three protection films become thicker toward an image-displaying surface of the display panel.

10. The display device of claim 1, wherein the protection member further includes a black matrix disposed along an edge of a top surface or a bottom surface of one of the at least three protection films.

11. The display device of claim 1, wherein the protection member further includes:

a coating layer over the at least three protection films, and a functional layer over the coating layer.

12. A display device, comprising:

a display panel configured to display an image, the display panel being a folding display panel that folds in a folding direction; and a protection member over the display panel, the protection member including a first protection film, a second protection film over the first protection film, a third protection film over the second protection film, a first adhesive layer disposed between the first protection film and the second protection film, and a second adhesive layer between the second protection film and the third protection film, wherein the first protection film, the second protection film, and the third protection film are each integrally formed and include a same material, wherein relative thicknesses of the first protection film and the second protection film decrease toward the folding direction of the display panel, and wherein relative thicknesses of the second protection film and the third protection film decrease toward the folding direction of the display panel.

13. The display device of claim 12, wherein the first adhesive layer directly contacts both the first protection film and the second protection film.

14. The display device of claim 13, wherein the first protection film and the second protection film are transparent films made of triacetyl cellulose (TAC), cycloolefin polymer (COP), or a combination thereof.

15. The display device of claim 13, wherein the first protection film, the second protection film, and the third protection film are transparent films made of triacetyl cellulose (TAC), cycloolefin polymer (COP), or a combination thereof.

16. The display device of claim 15, wherein the first adhesive layer directly contacts both the first protection film and the second protection film, and wherein the second adhesive layer directly contacts both the second protection film and the third protection film.

17. The display device of claim 12, further comprising:

a polarizing plate between the display panel and the protection member; and a front member over the polarizing plate and the protection member.

18. The display device of claim 17, wherein the display panel includes a plurality of light emitting devices, and the polarizing plate, the front member, the first protection film, and the second protection film are directly above the display panel.

* * * * *